United States Patent
Phillips et al.

(10) Patent No.: US 9,261,414 B2
(45) Date of Patent: Feb. 16, 2016

(54) OVERHEAD CONDUCTOR SENSOR

(75) Inventors: Andrew John Phillips, Harrisburg, NC (US); Mark Major, San Antonio, TX (US); Robert Carlton Lynch, Fuquay-Varina, NC (US); Kyle Hill, Concord, NC (US); Sam Harrell, Concord, NC (US); Brandon Rummage, Concord, NC (US)

(73) Assignee: ELECTRIC POWER RESEARCH INSTITUTE, INC., Charlotte, NC (US)

( * ) Notice: Subject to any disclaimer, the term of this patent is extended or adjusted under 35 U.S.C. 154(b) by 583 days.

(21) Appl. No.: 13/551,085

(22) Filed: Jul. 17, 2012

(65) Prior Publication Data

US 2013/0022078 A1    Jan. 24, 2013

Related U.S. Application Data

(60) Provisional application No. 61/510,154, filed on Jul. 21, 2011.

(51) Int. Cl.
   *G01K 7/00* (2006.01)
   *G01K 1/14* (2006.01)
   *G01R 1/22* (2006.01)

(52) U.S. Cl.
   CPC . *G01K 1/143* (2013.01); *G01R 1/22* (2013.01)

(58) Field of Classification Search
   CPC ........................................... H02G 1/02
   See application file for complete search history.

(56) References Cited

U.S. PATENT DOCUMENTS

| 4,728,887 A | 3/1988 | Davis |
| 4,794,327 A * | 12/1988 | Fernandes ..................... 324/126 |
| 4,847,780 A | 7/1989 | Gilker et al. |
| 5,341,088 A * | 8/1994 | Davis ............................ 324/106 |
| 5,610,512 A | 3/1997 | Selcuk |
| 6,205,867 B1 | 3/2001 | Hayes et al. |
| 6,523,424 B1 | 2/2003 | Hayes et al. |
| 7,002,331 B2 | 2/2006 | Sae-Ueng et al. |
| 7,067,829 B2 | 6/2006 | Richards et al. |

(Continued)

FOREIGN PATENT DOCUMENTS

KR          101040732          6/2011

OTHER PUBLICATIONS

Phleps, Stefanie, Supplementary European Search Report for Application EP12815135, Jan. 19, 2015, EPO, The Hague.

(Continued)

*Primary Examiner* — Lisa Caputo
*Assistant Examiner* — Nasir U Ahmed
(74) *Attorney, Agent, or Firm* — Trego, Hines & Ladenheim, PLLC; Brandon Trego

(57) ABSTRACT

An overhead conductor sensor for measuring various parameters that affect an overhead conductor is disclosed. The overhead conductor sensor includes an electronics housing having first and second opposing ends, a jaw assembly having a first jaw connected to the first end of the electronics housing and a second jaw pivotally attached to the first jaw to allow the jaw assembly to move between an open position for receiving an overhead conductor therein and a closed position for securing the sensor to the overhead conductor, and a thermocouple assembly electrically connected to electronics housed in the electronics housing and extending through the jaw assembly for engagement with the overhead conductor. The thermocouple assembly is adapted to measure a temperature of the overhead conductor.

7 Claims, 15 Drawing Sheets

(56) References Cited

U.S. PATENT DOCUMENTS

| | | |
|---|---|---|
| 7,369,045 B2 | 5/2008 | Hansen |
| 7,494,271 B2 | 2/2009 | Scholtz et al. |
| 7,615,132 B2 | 11/2009 | Yasui et al. |
| 7,620,517 B2 | 11/2009 | Scholtz et al. |
| 7,641,387 B2 | 1/2010 | Engelhardt et al. |
| 7,956,763 B2 * | 6/2011 | Mies ............................. 340/664 |
| 2009/0243876 A1 | 10/2009 | Lilien et al. |
| 2010/0013457 A1 * | 1/2010 | Nero, Jr. ........................ 324/119 |

OTHER PUBLICATIONS

Electric Power Research Institute, Inc. Sensor Technologies for a Smart Transmission System, An EPRI White Paper, Dec. 2009, Palo Alto, CA.

\* cited by examiner

OVERHEAD CONDUCTOR SENSOR

This application claims the benefit of Provisional Application No. 61/510,154 filed on Jul. 21, 2011.

BACKGROUND OF THE INVENTION

This application relates to an overhead conductor sensor for measuring various parameters that affect an overhead conductor and indicate or troubleshoot potential failures in the conductor of its components.

With an ever-increasing need for electric utilities to transfer more power through existing power lines, utilities must take into account various factors. One such factor is sag in the conductor. As power loads increase, conductors sag due to increased temperatures in the conductor which causes thermal expansion. Since a sagging conductor may cause clearance and safety issues, making sure the conductor does not go beyond reasonable sag is of the up most importance. Other factors include failing connectors and vibrating or galloping conductors. In addition, other parameters become of importance when dealing with the above factors, such as ambient air temperature and wind speed and direction.

It is challenging to measure conductor and connector parameters on an overhead transmission line as the conductor is energized up to 765 kV and above. Accordingly, there is a need for an overhead conductor sensor that can measure parameters of an overhead conductor to indicate failing connectors, troubleshoot vibrating or galloping conductors, dynamically rate conductors, aid in conductor location surveys, and know what the current is flowing in the conductor.

BRIEF SUMMARY OF THE INVENTION

These and other shortcomings of the prior art are addressed by the present invention, which provides an overhead conductor sensor that is of lower cost, has a low power consumption design, includes power harvesting capabilities, has an increased temperature measurement accuracy, and is easy to install. Further, the overhead conductor sensor is easy to install on an energized conductor, does not impact conductor temperatures via thermal heat sinking or wind sheltering, adjusts to different conductor sizes, and uses plug and play communications options to allow for upgrading and the use of different communications equipment.

According to one aspect of the present invention, an overhead conductor sensor includes an electronics housing having first and second opposing ends, a jaw assembly having a first jaw connected to the first end of the electronics housing and a second jaw pivotally attached to the first jaw to allow the jaw assembly to move between an open position for receiving an overhead conductor therein and a closed position for securing the sensor to the overhead conductor, and a thermocouple assembly electrically connected to electronics housed in the electronics housing and extending through the jaw assembly for engagement with the overhead conductor. The thermocouple assembly is adapted to measure a temperature of the overhead conductor.

According to another aspect of the invention, an overhead conductor sensor includes an electronics housing having first and second opposing ends, a jaw assembly, and a thermocouple assembly. The electronics housing houses first and second electronic boards. The jaw assembly includes a first jaw connected to the first end of the electronics housing and a second jaw pivotally attached to the first jaw to allow the jaw assembly to move between an open position for receiving an overhead conductor therein and a closed position for securing the sensor to the overhead conductor, and a clamping assembly having first and second clamping mechanisms. The first clamping mechanism is connected to the first jaw and the second clamping mechanism is adjustably mounted to the second jaw to allow the clamping assembly to receive and provide a clamping force around overhead conductors of varying diameters, thereby securing the sensor to the overhead conductor. The thermocouple assembly is electrically connected to the first electronics board and extends through an aperture of the first clamping mechanism for engagement with the overhead conductor. The thermocouple assembly is adapted to measure a temperature of the overhead conductor.

According to another aspect of the invention, an overhead conductor sensor includes an electronics housing having first and second opposing ends, a jaw assembly, and a thermocouple assembly. The electronics housing houses first and second electronic boards. The jaw assembly includes a first jaw connected to the first end of the electronics housing and a second jaw pivotally attached to the first jaw to allow the jaw assembly to move between an open position for receiving an overhead conductor therein and a closed position for securing the sensor to the overhead conductor, and a clamping assembly having first and second clamping mechanisms. The first clamping mechanism is connected to the first jaw and the second clamping mechanism is adjustably mounted to the second jaw to allow the clamping assembly to receive and provide a clamping force around overhead conductors of varying diameters, thereby securing the sensor to the overhead conductor. The thermocouple assembly is electrically connected to the first electronics board and extends through an aperture of the first clamping mechanism for engagement with the overhead conductor. The thermocouple assembly is adapted to measure a temperature of the overhead conductor and includes a thermocouple having first and second ends, a thermocouple tip, an insulator bushing, and a spring. The first end of the thermocouple is electrically connected to the first electronics board and the second end extends through the aperture. The thermocouple tip is attached to the second end of the thermocouple and includes an expandable central bore for receiving and clamping around the second end of the thermocouple. The insulator bushing is positioned between the thermocouple tip and the first clamping mechanism to prevent the tip from being pushed through the aperture by an overhead conductor. The spring is positioned between the bushing and a stop positioned in the first jaw to provide a mechanical force to the bushing, thereby pressing the tip into the overhead conductor being measured.

BRIEF DESCRIPTION OF THE DRAWINGS

The subject matter that is regarded as the invention may be best understood by reference to the following description taken in conjunction with the accompanying drawing figures in which.

DETAILED DESCRIPTION OF THE INVENTION

Figure 1:
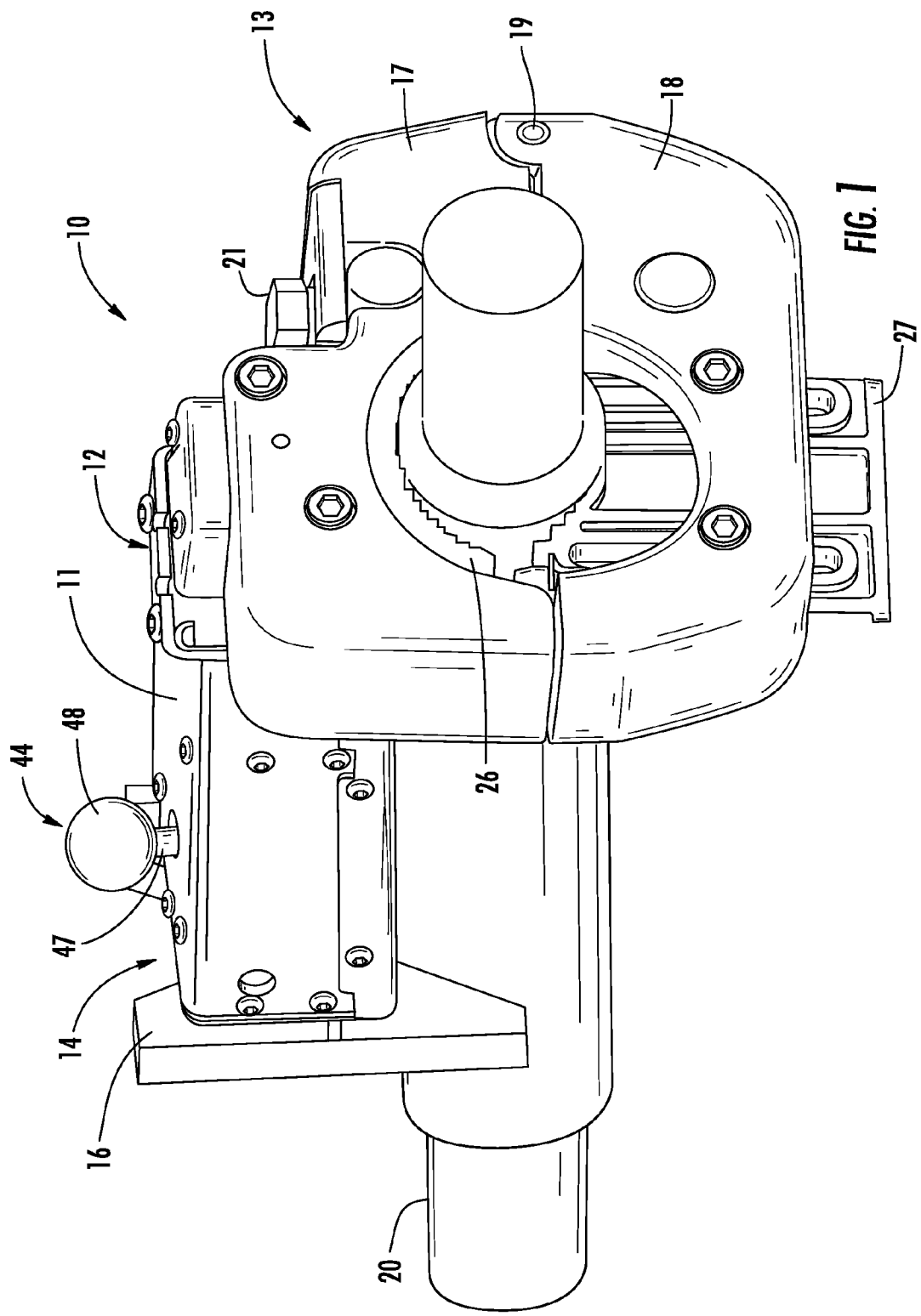
FIG. 1 is a perspective view of an overhead conductor sensor according to an embodiment of the invention.

Referring to the drawings, an exemplary overhead conductor sensor according to an embodiment of the invention is illustrated in FIG. 1 and shown generally at reference numeral 10. The sensor 10 includes an electronics housing 11 having a first end 12 connected to a jaw assembly 13 and a second opposing end 14 connected to a stabilizer 16. All edges of conductive components are rounded to ensure that the electrical field magnitudes are low, thereby preventing corona activity. Further, the sensor is filled with an epoxy compound to provide environmental protection.

Figure 2:
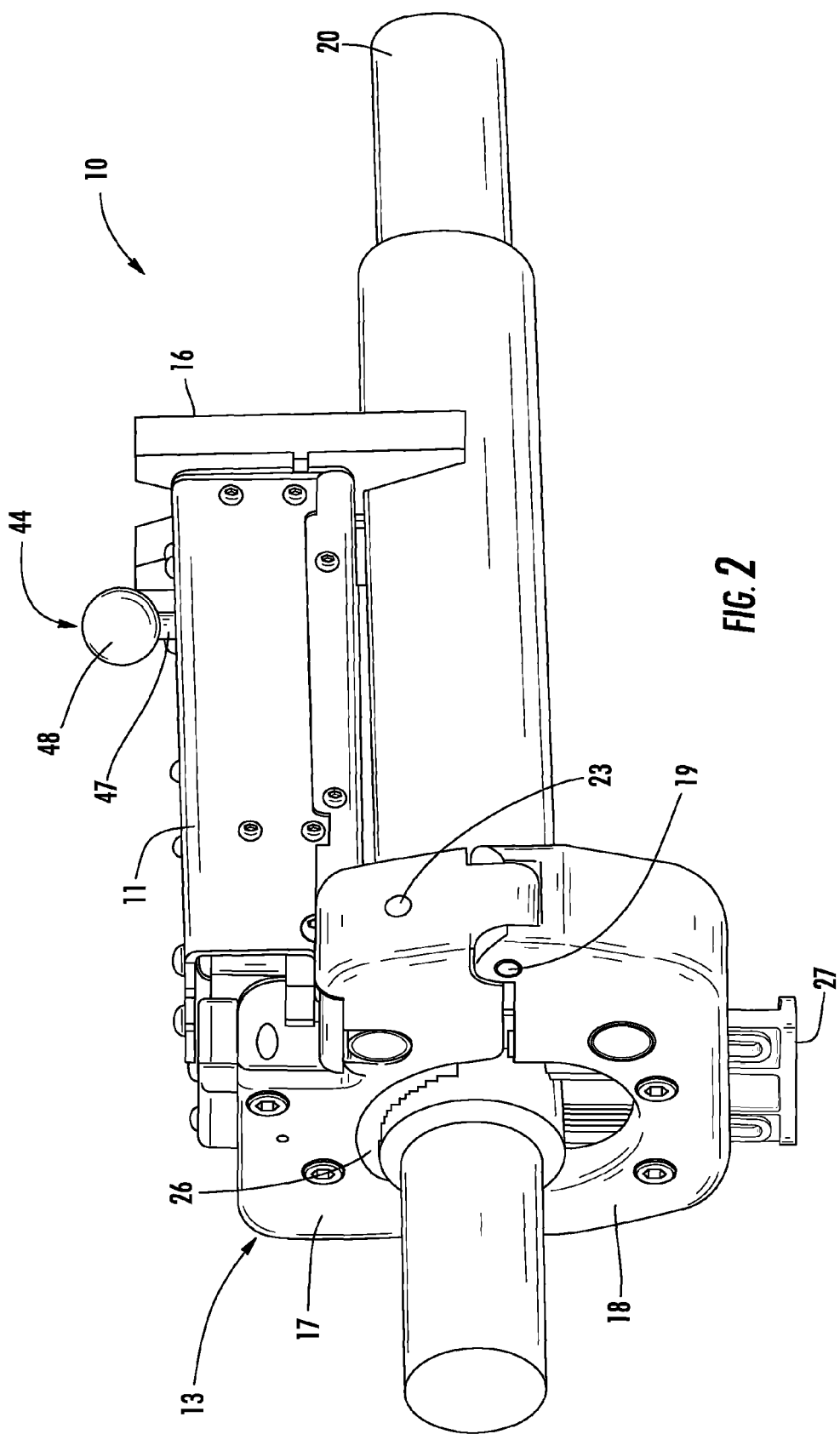
FIG. 2 is another perspective view of the sensor of FIG. 1.
Figure 3:
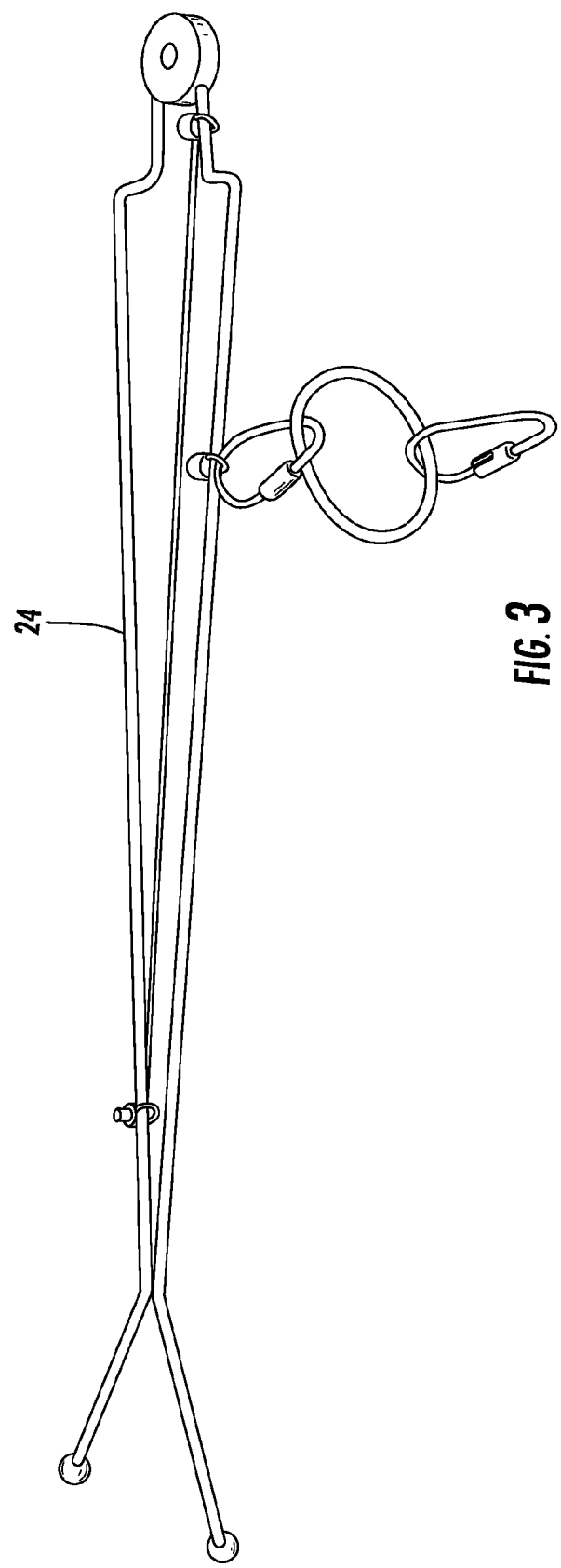
FIG. 3 shows a bonding electrode for use with the sensor of FIG. 1.

As shown in FIG. 2, the jaw assembly 13 includes a socket 23 for allowing a hot stick (not shown) and a bonding electrode 24, FIG. 3, to be attached to the sensor 10 by a mating fastener. The hotstick allows the sensor 10 to be placed onto an energized conductor and the bonding electrode 24 ensures that an arc does not go through the sensor. The hotstick and bonding electrode are removed after installation.

Figure 4:
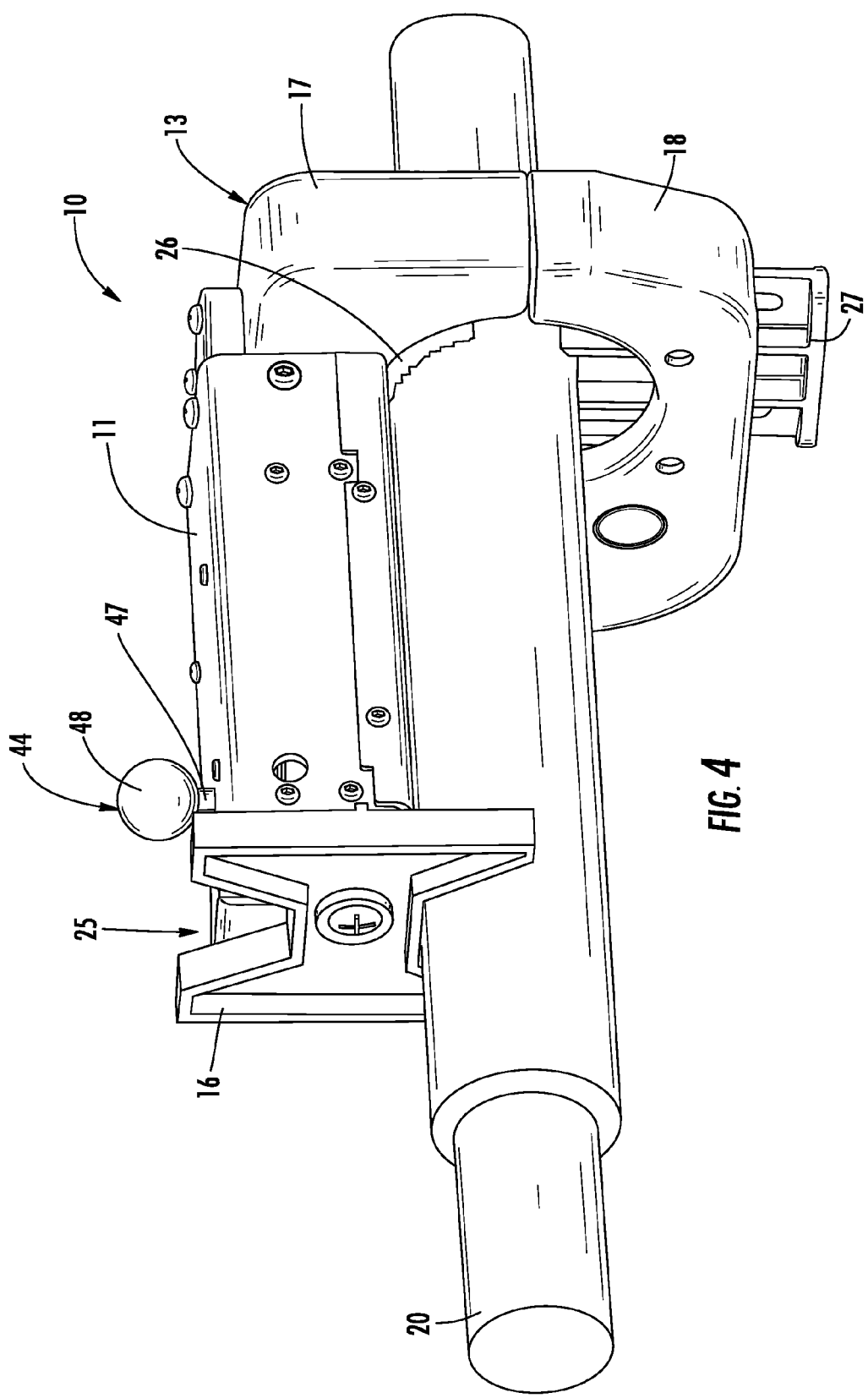
FIG. 4 is another perspective view of the sensor of FIG. 1.
Figure 5:
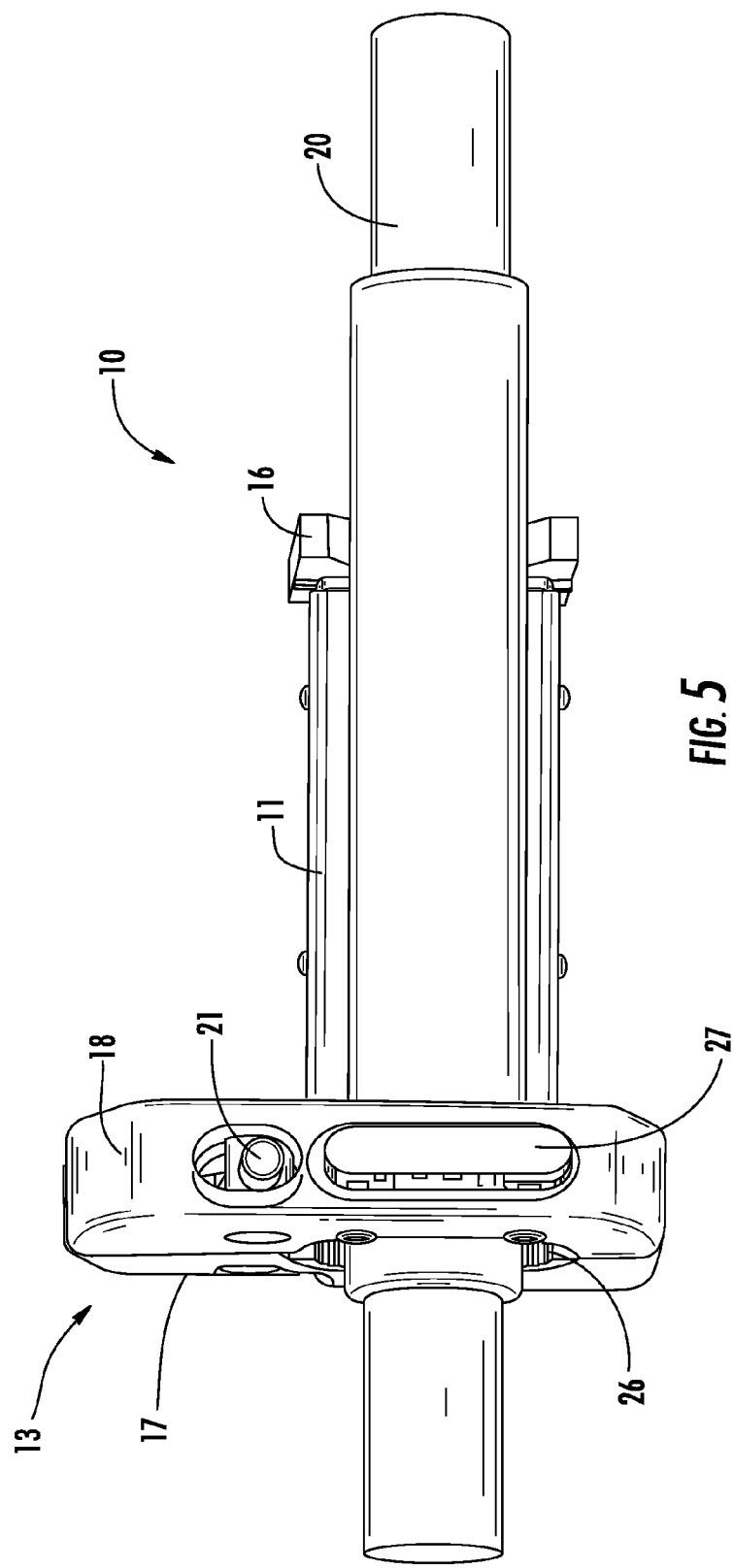
FIG. 5 is a bottom view of the sensor of FIG. 1.
Figure 6:
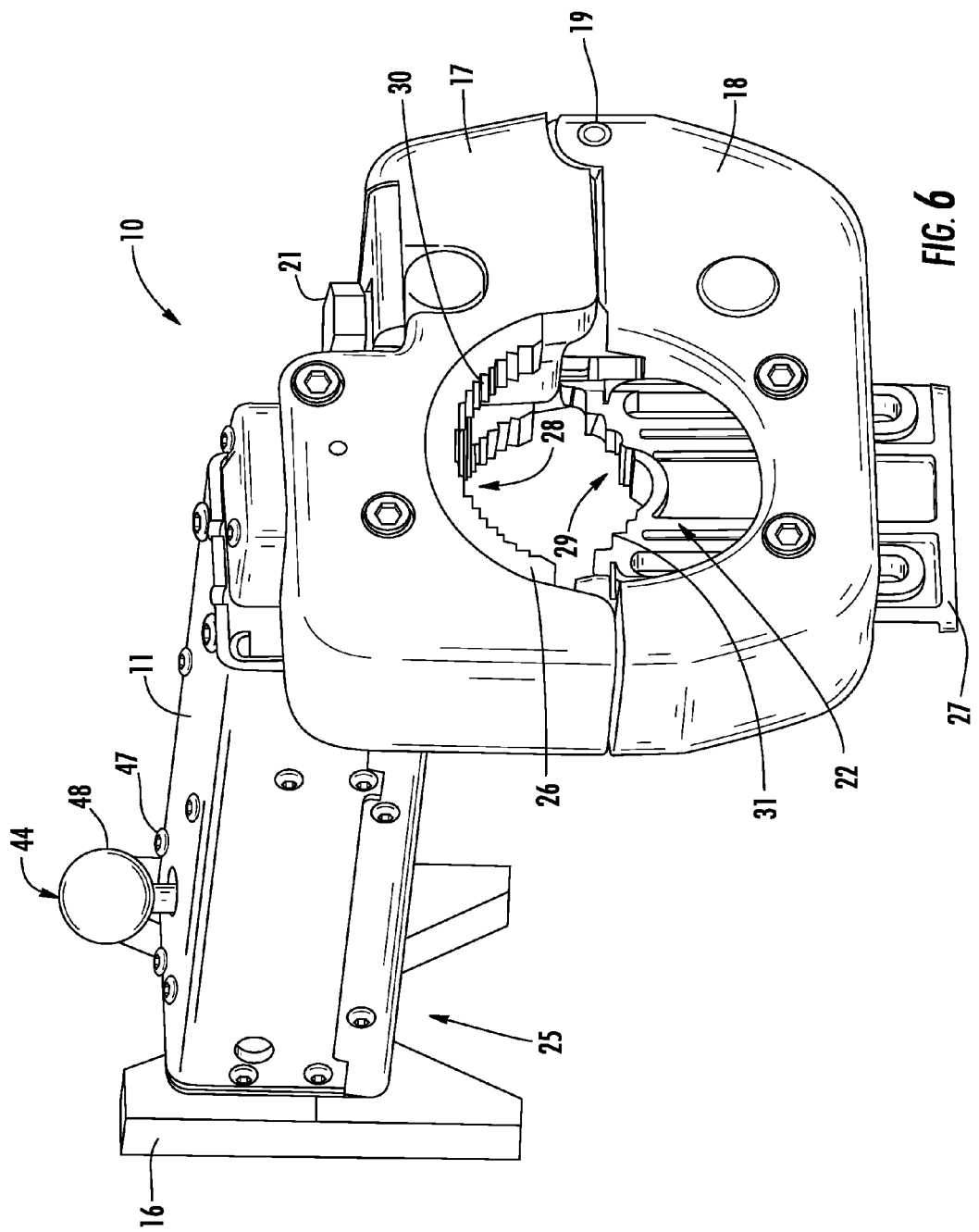
FIG. 6 is another perspective view of the sensor of FIG. 1 showing a jaw assembly of the sensor.

Referring to FIG. 4, the stabilizer 16 is removably attached to the housing 11 and is adapted for use in vibration installations. The stabilizer 16 includes a plurality of slots 25 for receiving a conductor. The slots 25 are conductor size specific, i.e., each slot is sized for a specific size of conductor. As shown, the stabilizer 16 includes two different sized slots 25 to accommodate two different sized conductors. However, it should be appreciated, that the stabilizer 16 may include additional slots to accommodate a greater number of conductors. For example, the stabilizer could be cross-shaped to accept four different sized conductors. To accommodate a different sized conductor, the stabilizer 16 is simply rotated to the slot 25 that matches the conductor size.

Referring to FIGS. 5-8, the jaw assembly 13 includes a first jaw 17 pivotally attached to a second jaw 18 via pivot joint 19 to allow the jaw assembly 13 to move between an open position, to receive a conductor therein, and closed position, to secure the sensor 10 to a conductor 20, FIG. 1. The jaw assembly 13 is secured in the closed position by a fastener 21 which extends through the first and second jaws 17, 18. The fastener 21 may be tightened by a standard wrench or socket type tool.

The jaw assembly 13 further includes an adjustable clamping assembly 22 having first and second clamping mechanisms 26, 27. Both clamping mechanisms 26 and 27 include a concave inner surface 28 and 29 to complement the rounded outside surface of the conductor 20. The inner surfaces 28 and 29 also include a plurality of steps 30 and 31 that act like teeth to secure the sensor 10 to the conductor 20. Together, the concave inner surfaces 28, 29 and steps 30, 31 of the clamping mechanisms 26, 27 allow the clamping assembly 22 to mate with and secure the sensor 10 to various sized conductors, i.e., conductors of different diameters. As shown, the clamping assembly 22 is made of a thermoplastic; however, other suitable materials may be used.

Figure 7:
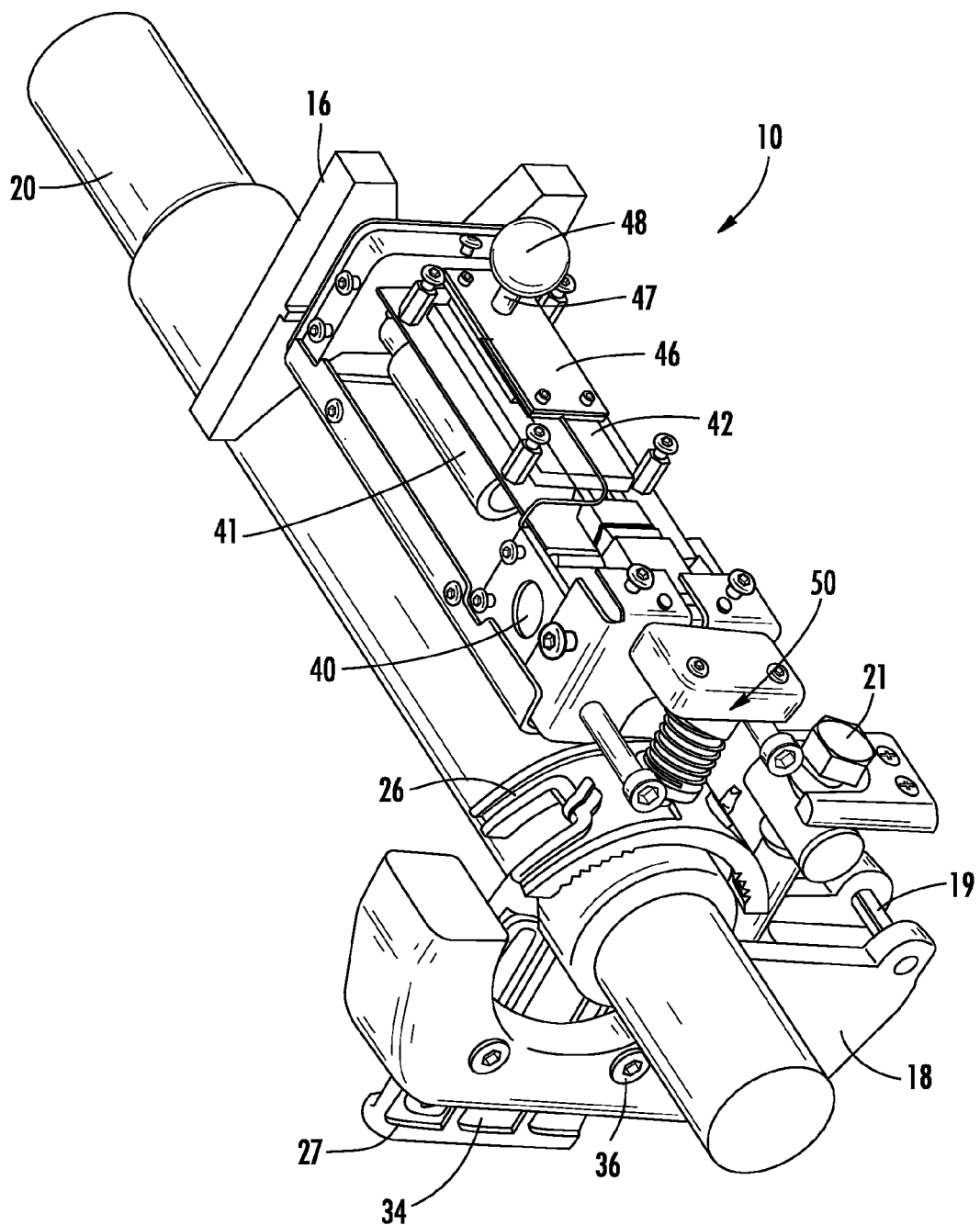
FIG. 7 shows an upper clamping mechanism of the jaw assembly of FIG. 6.
Figure 8:
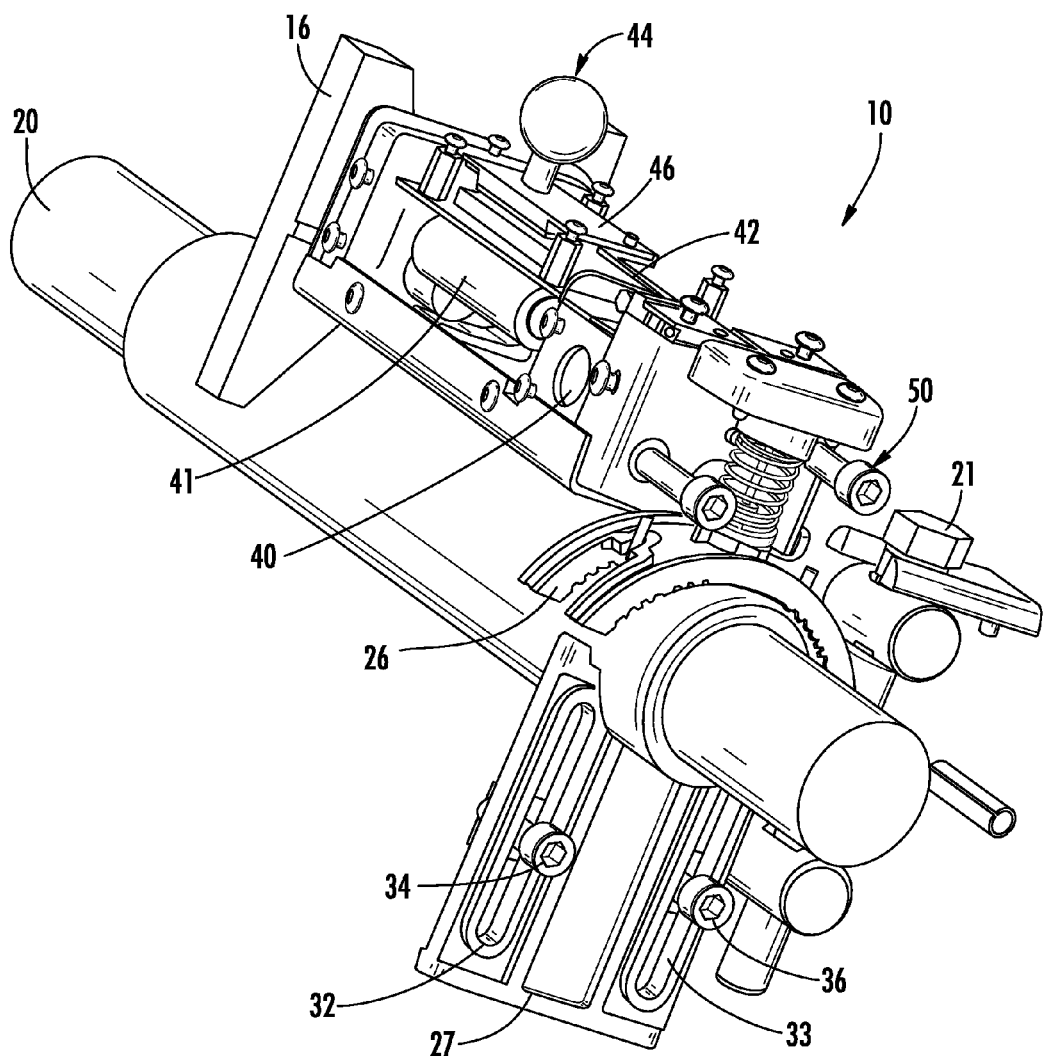
FIG. 8 shows the upper and lower clamping mechanisms of the jaw assembly of FIG. 6.

Referring specifically to FIGS. 7 and 8, clamping mechanism 27 includes elongated slots 32 and 33 adapted to receive fasteners 34 and 36 therethrough. The slots 32, 33 allow the clamping mechanism 27 to be slidably mounted to jaw 18 to allow the clamping assembly 22 to be moved from a non-clamping position, to receive conductors of varying diameters, to a clamping position to secure the sensor 10 to the conductor, FIG. 1.

Figure 9:
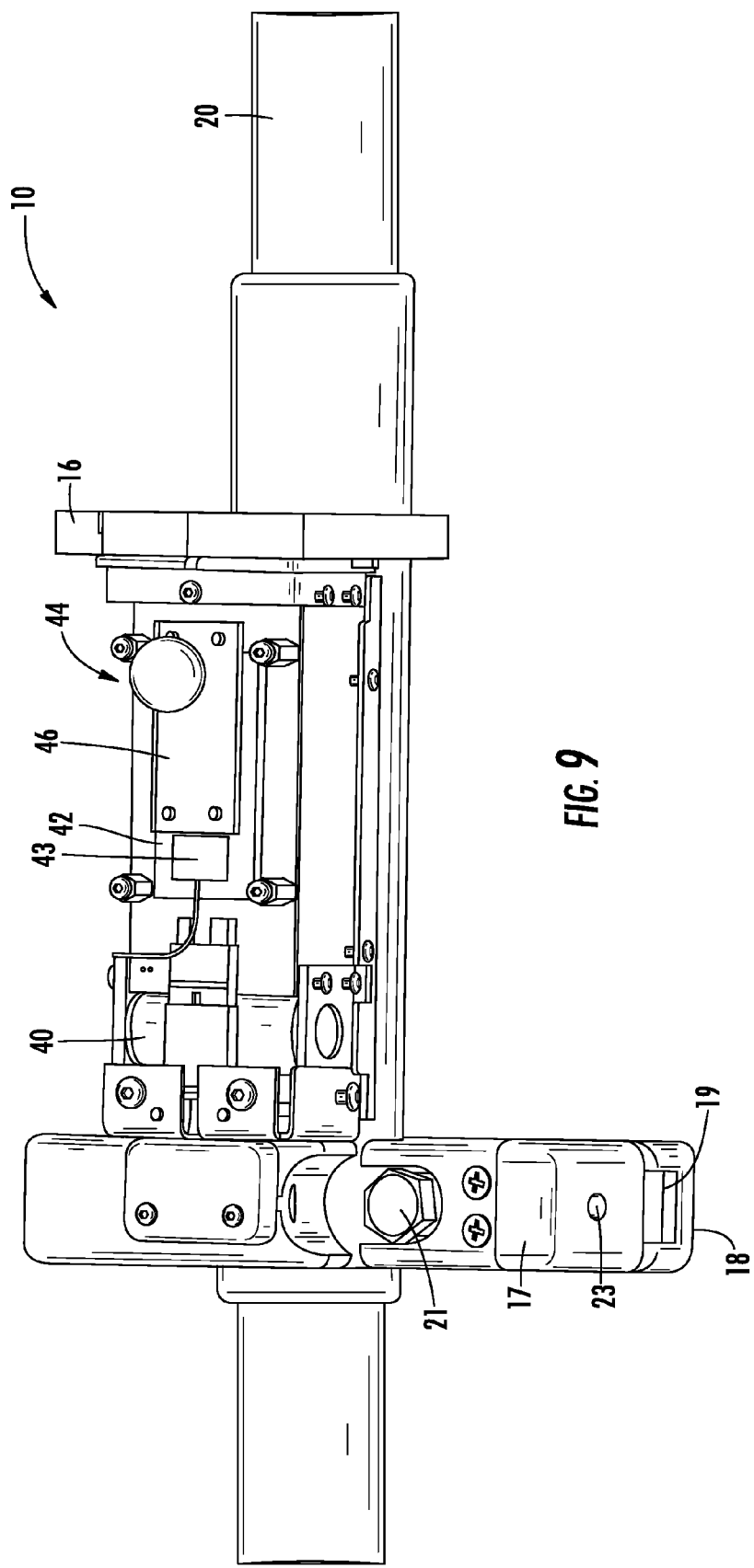
FIGS. 9 and 10 show electronics contained in an electronics housing of the sensor of FIG. 1.
Figure 10:
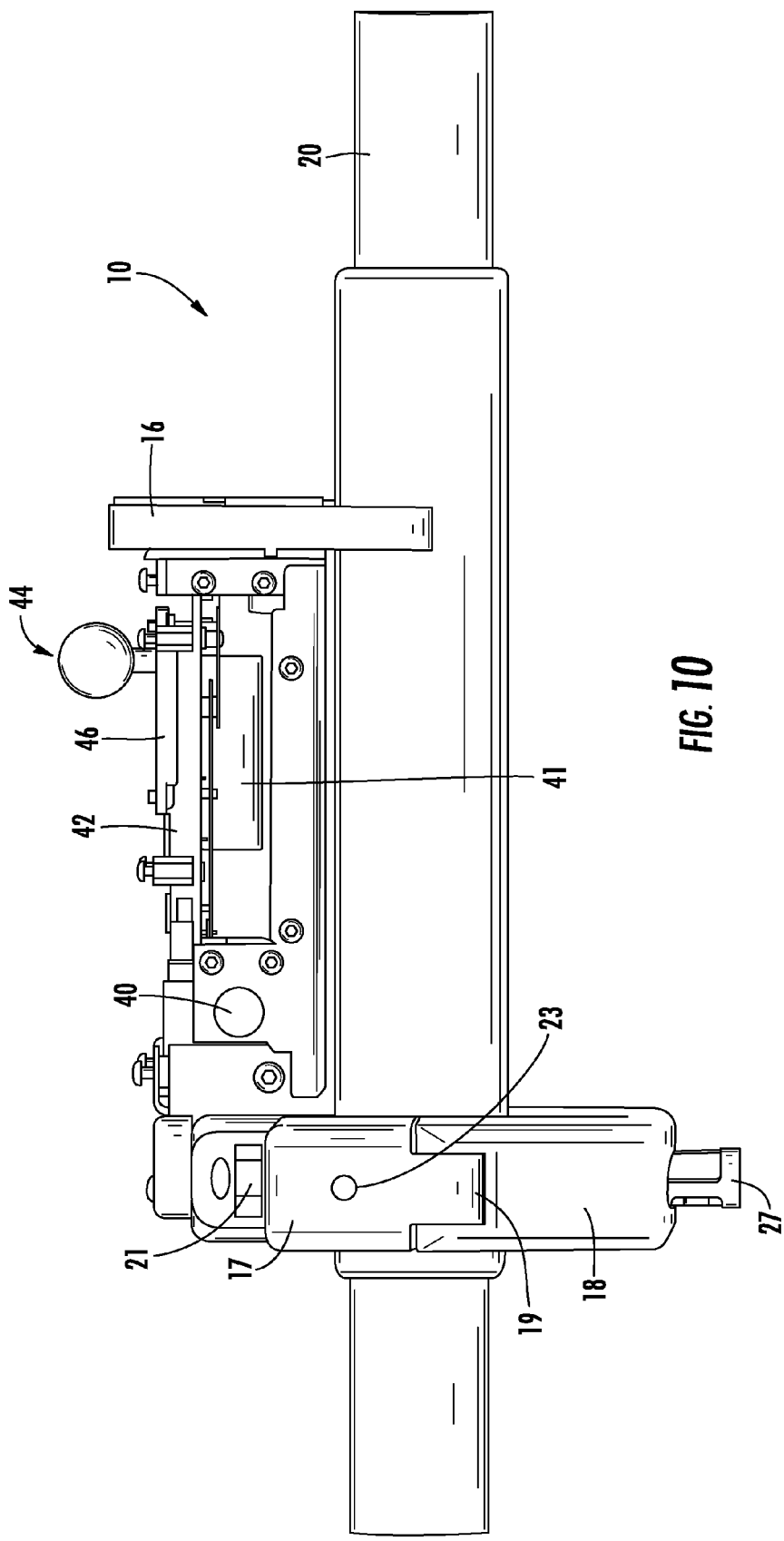

Referring to FIGS. 9 and 10, the electronics housing 11 includes a coil 40, a battery 41, a first electronic board 42, a second electronic board 43, an antenna 44 and matching strip-line PCB board 46. The coil 40 includes a ferrite core with windings wrapped around the core and is adapted to couple with a magnetic field from the conductor 20 to harvest power therefrom and to measure the amount of current flowing through the conductor 20. As shown, the battery 41 is a non-reachargeable battery and provides power to the sensor 10 when there is no or low current flowing through the conductor. The battery will last 2 years with no power. It should be appreciated that the battery may also be a rechargeable battery adapted to be recharged by the coil 40 when needed.

Figure 11:
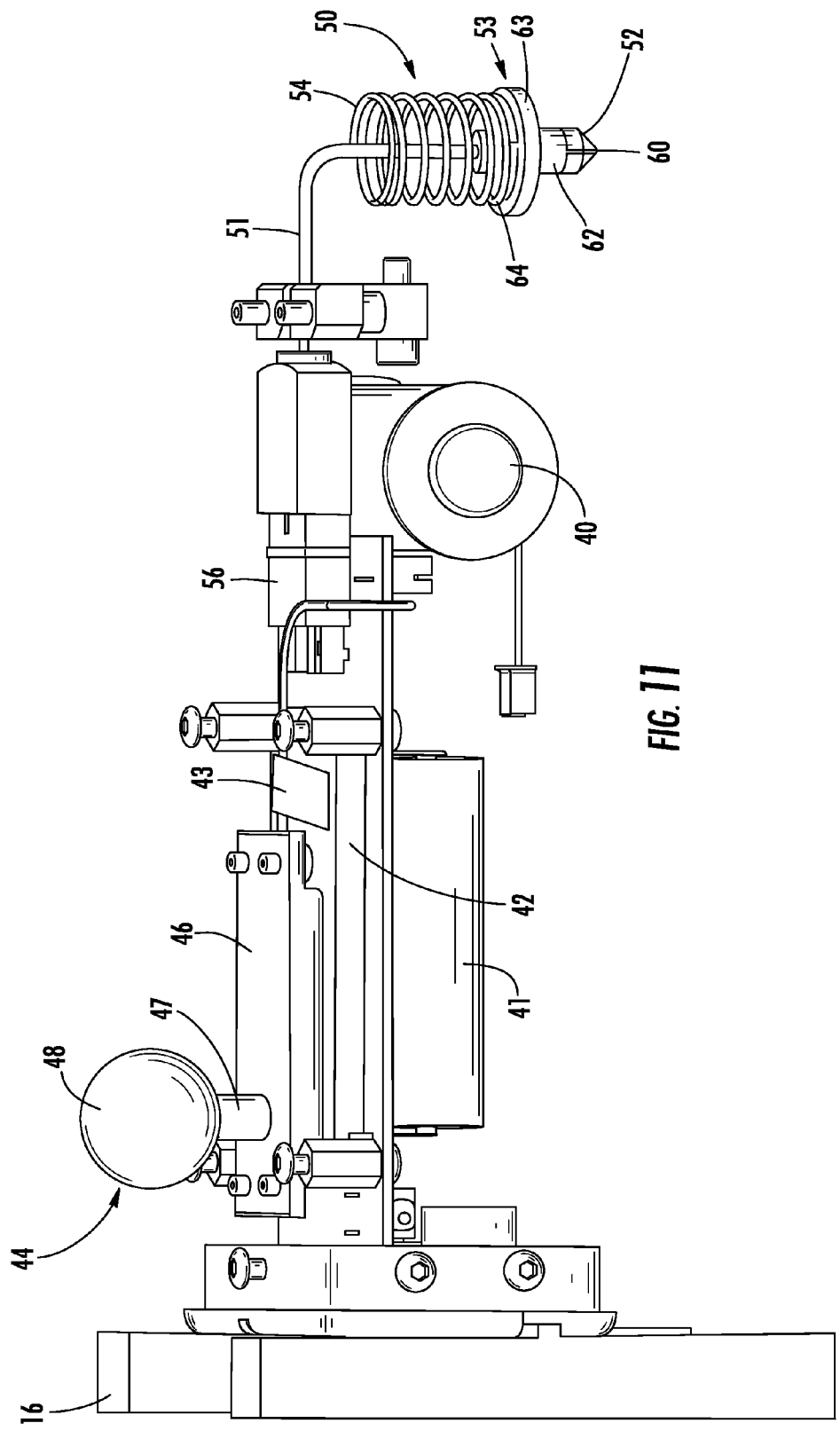
FIG. 11 shows a thermocouple assembly connected to the electronics of FIGS. 9 and 10.

The first electronic board 42 performs power harvesting, measurement and processing, storage of signals, and controls the whole measurement communications process. The board 42 has as inputs for voltage from the coil 40 and a thermocouple assembly 50, shown in FIG. 11. The board 42 measures the voltage from the coil 40 to get a measurement of current flowing through the conductor 20. The voltage from the coil 40 is also harvested to power the sensor 10 (if high enough—if too low switches to battery 41). The board 42 also includes a 3D accelerometer chip which takes samples from DC to 2000 samples per second.

The second electronic board 43 is an RF transmitter. The board 43 is adapted for plug and play so that different RF boards can be utilized to enable different communications protocols, frequencies, and/or methods. The board 43 provides for two way RF communications to allow firmware of the sensor 10 to be updated or reset and to allow data to be downloaded from the sensor 10 to a remote location having computers or processors with software adapted to perform specified calculations. All of the electronics and RF communications are designed to be very low power to enable power harvesting and long battery life.

The antenna 44 includes a stalk 47 that extends through the housing 11 and an antenna ball 48 and is electrically connected to the board 43. The diameter of the ball and the height of the stalk are optimized for both RF transmission and omni-directional beam pattern. Further, the shape of the antenna ball is optimized to prevent corona. The matching strip-line PCB board 46 is electrically connected to the antenna 44 and sits behind the antenna 44 to ensure that power is fully transmitted to the antenna 44.

Referring to FIGS. 11-14, a thermocouple 50 assembly is electrically connected to the first electronic board 42 and is adapted to measure conductor temperature. The thermocouple assembly 50 includes a thermocouple 51, a thermocouple tip 52 which houses a portion of the thermocouple 51, an insulator bushing 53 positioned adjacent to or behind the tip 52, a spring 54 positioned adjacent to or behind the bushing 53, and a plug and play connector 56 to electrically connect the thermocouple 51 to the board 42. The thermocouple assembly 50 is the only thermal and electrically conductive component in contact with the conductor 20 to prevent heat sinking and to enable a single point ground so that currents do not flow through the sensor 10.

Figure 12:
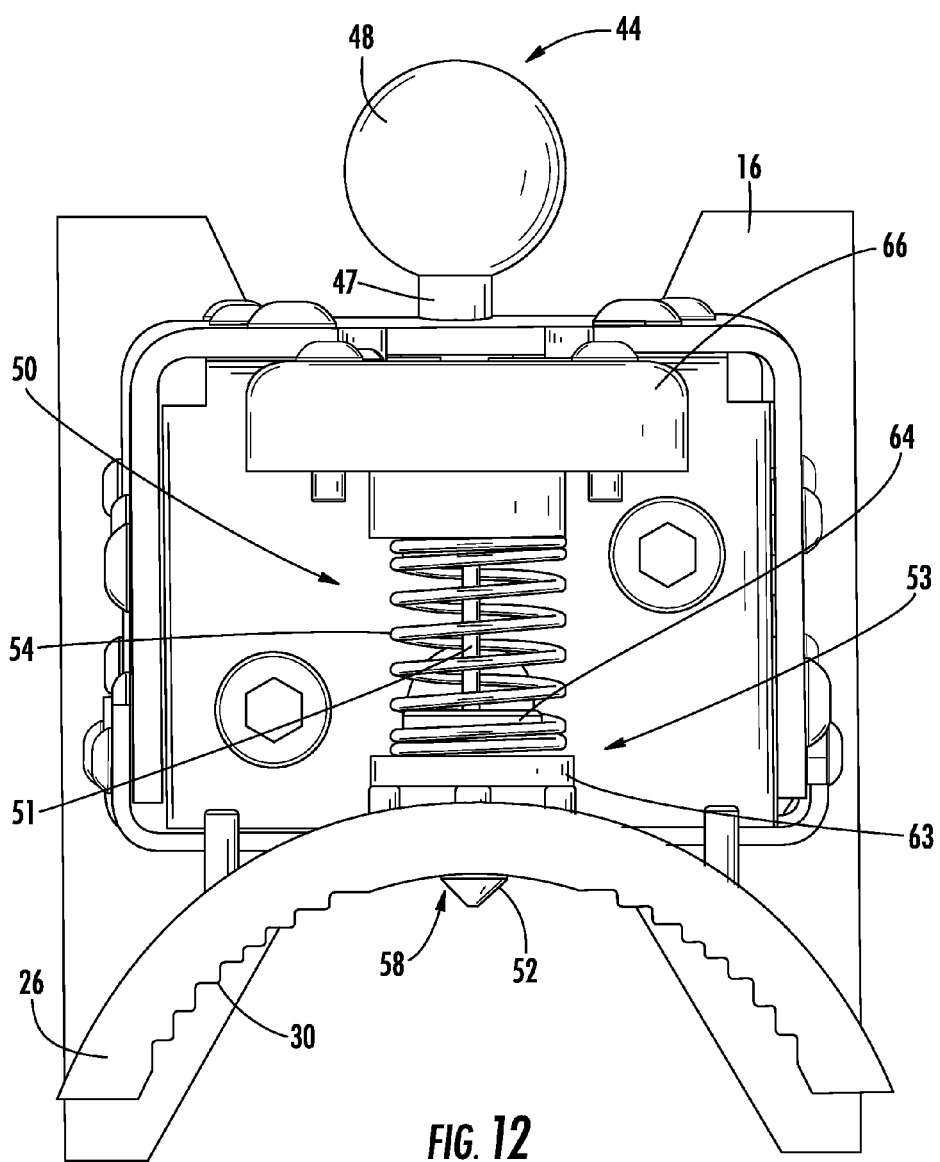
FIGS. 12 and 13 show the thermocouple assembly of FIG. 11 connected with the jaw assembly of FIG. 6.
Figure 13:
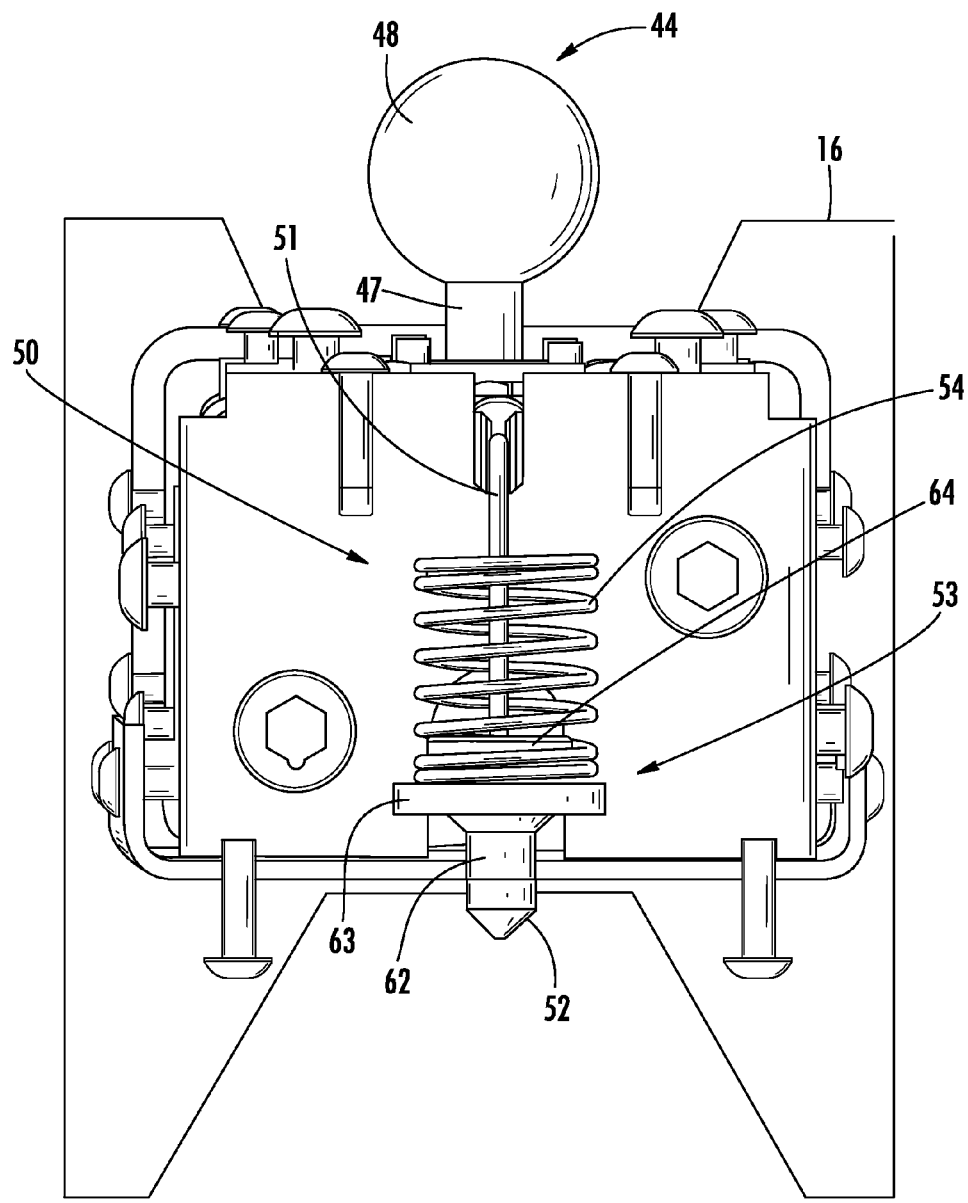

As shown in FIG. 12, the thermocouple assembly 50 is engaged with clamping mechanism 26 such that the thermocouple tip 52 extends through an aperture 58 in the clamping mechanism 26 for contact with the conductor 20. Because the clamping mechanism 26 is made from thermoplastic, it provides insulation between the jaw assembly 13 and the conductor 20, thereby preventing heat sinking. In addition, the thermocouple tip 52 is insulated from the jaw assembly 13 by the insulator bushing 53.

Figure 14:
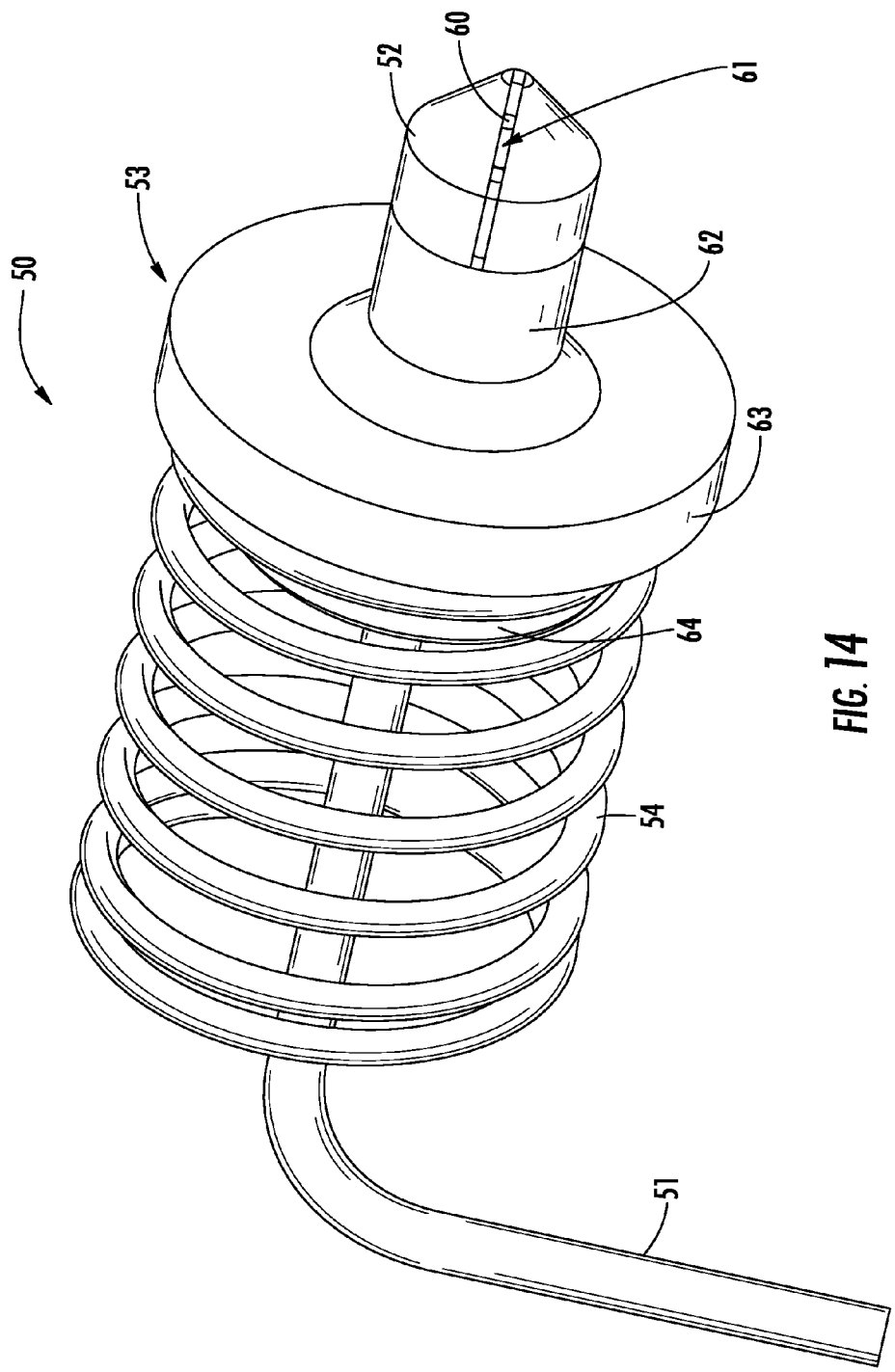
FIG. 14 is a perspective of the thermocouple assembly of FIG. 11.

As illustrated in FIG. 14, the thermocouple tip 52 has a slot 60 machined in one side of the tip 52. In assembling the tip 52 onto the thermocouple 51, a feeler gauge or other suitable device is inserted into the slot 60 to open up a central bore 61 of the tip 52. The thermocouple 51 is then inserted into the bore 61 and the feeler gauge is removed from the slot 60, resulting in a mechanical clamping force by the tip 52 around the thermocouple 51. The bore 61 is then filled with an epoxy or other suitable compound to provide a second mechanical attachment.

As shown, the bushing 53 includes a first cylindrical portion 62 for mating with the tip 52, a second larger cylindrical portion 63 to engage the clamping mechanism 26, FIG. 12, and provide a stop so that the bushing 53 cannot be pushed through the aperture 58 and to provide a surface for the spring 54 to push against, and a third cylindrical portion 64 sized to mate with an inner diameter of the spring 54 and adapted to hold the spring 54 in position by extending into an inner bore of the spring 54. The spring 54 is positioned between the bushing 53 and a stop 66 to provide a mechanical force to the bushing 53, thereby shoving the tip 52 into the conductor 20 or connector (not shown) being measured.

Figure 15:
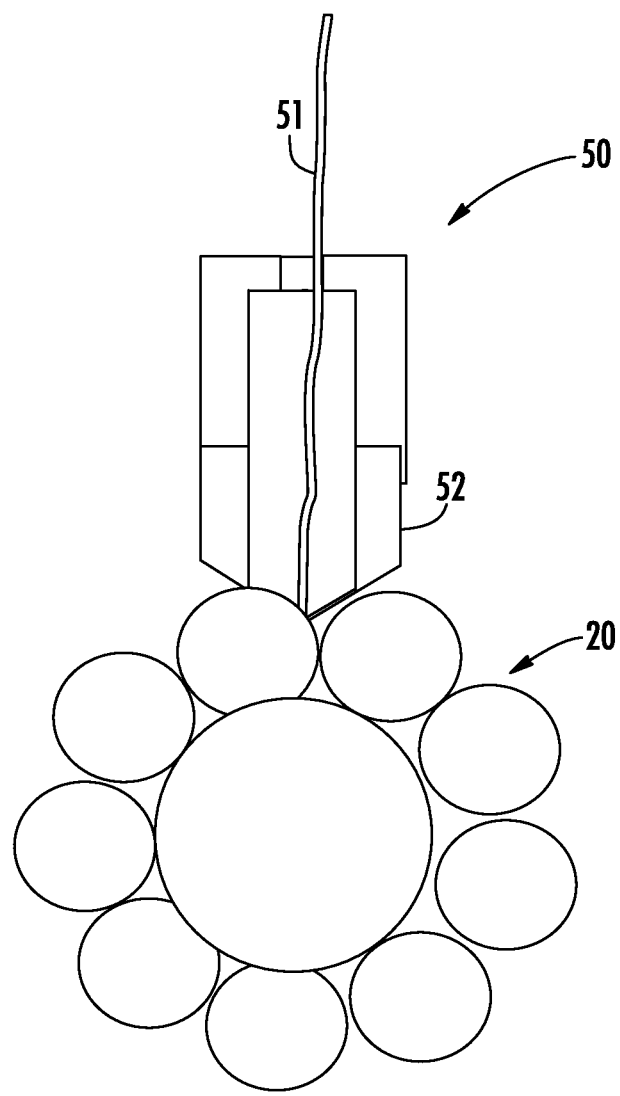
FIG. 15 shows a tip of the thermocouple assembly engaging a conductor.

As illustrated in FIG. 15, the shape of the tip 52 is pointed so that it will locate itself between conductor strands. In addition, aperture 58 is sized to be slightly larger than the diameter of the tip 52 and first cylindrical portion 62 of the bushing 53 to allow play so that the tip 52 can move side-to-side and ensure that the tip 52 falls between the strands.

In operation, the sensor 10 can perform on board measurements and algorithms/calculations for present conductor and ambient temperature—rolling average, present current, maximum temperature, current at the time of maximum temperature, histogram of temperatures (# of minutes/hour in a specific temperature range), inclination in three axes, raw vibration waveforms in three axes—10 second clips, Fast Fourier Transform of the waveform to provide frequency content of vibration waveform, and Calculate displacement from the acceleration measured.

The foregoing has described an overhead conductor sensor. While specific embodiments of the present invention have been described, it will be apparent to those skilled in the art that various modifications thereto can be made without departing from the spirit and scope of the invention. Accordingly, the foregoing description of the preferred embodiment of the invention and the best mode for practicing the invention are provided for the purpose of illustration only and not for the purpose of limitation.

We claim:

1. An overhead conductor sensor, comprising:
   (a) an electronics housing having first and second opposing ends, wherein the electronics housing houses:
      (i) an antenna extending through the electronics housing and electrically connected to electronics housed in the housing; and
      (ii) a strip-line PCB board electrically connected to the antenna to ensure power is fully transmitted to the antenna;
   (b) a jaw assembly having a first jaw connected to the first end of the electronics housing and a second jaw pivotally attached to the first jaw to allow the jaw assembly to move between an open position for receiving an overhead conductor therein and a closed position for securing the sensor to the overhead conductor, the jaw assembly further including a clamping assembly operably connected to the first and second jaws, the clamping assembly having a first clamping mechanism connected to the first jaw and a second clamping mechanism adjustably mounted to the second jaw to allow the clamping assembly to receive and provide a clamping force around the overhead conductor, thereby securing the sensor to the overhead conductor; and
   (c) a thermocouple assembly electrically connected to the electronics housed in the electronics housing and extending through the jaw assembly for engagement with the overhead conductor, the thermocouple assembly being adapted to measure a temperature of the overhead conductor.

2. The overhead conductor sensor according to claim 1, further including a stabilizer removably attached to the second end of the electronics housing, the stabilizer being adapted to stabilize the sensor on the overhead conductor.

3. The overhead conductor sensor according to claim 1, wherein the electronics housed in the housing include:
   (a) a first electronics board adapted to perform power harvesting, measurement and processing, and storage of signals;
   (b) a second electronics board adapted to provide two way radio frequency communications to allow firmware of the sensor to be updated and data collected by the sensor to be downloaded to a remote location, wherein the antenna is electrically connected to the second electronics board;
   (c) a coil adapted to harvest power from a magnetic field of the overhead conductor; and
   (d) a battery adapted to provide power to the sensor.

4. The overhead conductor sensor according to claim 1, wherein the jaw assembly further includes a socket for allowing a hot stick to be attached to the sensor, wherein the hot stick is used to position the sensor onto an energized overhead conductor.

5. The overhead conductor sensor according to claim 1, wherein the second clamping mechanism allows the clamping assembly to receive conductors of varying diameters.

6. The overhead conductor sensor according to claim 1, wherein the thermocouple assembly includes:
   (a) a thermocouple for measuring temperature of the overhead conductor; and
   (b) a thermocouple tip connected to an end of the thermocouple, the thermocouple tip houses a portion of the thermocouple and engages the overhead conductor during measurements.

7. The overhead conductor sensor according to claim 1, further including a fastener extending through the first and second jaws, the fastener configured to secure the jaw assembly in the closed position.

* * * * *